United States Patent
Gabric et al.

(10) Patent No.: US 7,276,300 B2
(45) Date of Patent: Oct. 2, 2007

(54) MICROELECTRONIC STRUCTURE HAVING A HYDROGEN BARRIER LAYER

(75) Inventors: Zvonimir Gabric, Zorneding (DE); Walter Hartner, Bad Abbach-Peising (DE); Matthias Krönke, Dresden (DE); Günther Schindler, Munich (DE)

(73) Assignee: Infineon Technologies AG, Munich (DE)

( * ) Notice: Subject to any disclaimer, the term of this patent is extended or adjusted under 35 U.S.C. 154(b) by 67 days.

(21) Appl. No.: 10/476,579

(22) PCT Filed: Apr. 22, 2002

(86) PCT No.: PCT/EP02/04422

§ 371 (c)(1),
(2), (4) Date: May 18, 2004

(87) PCT Pub. No.: WO02/091432

PCT Pub. Date: Nov. 14, 2002

(65) Prior Publication Data

US 2004/0191532 A1    Sep. 30, 2004

(30) Foreign Application Priority Data

May 3, 2001    (DE) ................. 101 21 657

(51) Int. Cl.
*B32B 9/00*    (2006.01)

(52) U.S. Cl. ............ 428/698; 428/699; 428/701; 428/702; 428/704

(58) Field of Classification Search ............ 428/698, 428/701–702, 209, 697, 699, 704; 365/145
See application file for complete search history.

(56) References Cited

U.S. PATENT DOCUMENTS

| 5,481,490 A | 1/1996 | Watanabe et al. |
| 5,523,595 A | 6/1996 | Takenaka et al. |
| 5,624,864 A | 4/1997 | Arita et al. |
| 6,027,947 A | 2/2000 | Evans et al. |
| 6,060,766 A | 5/2000 | Mehta et al. |

(Continued)

FOREIGN PATENT DOCUMENTS

DE    199 04 379    8/2000

(Continued)

OTHER PUBLICATIONS

Hong et al. "Protection of $SrBi_2Ta_2O_9$ ferroelectric capacitors from hydrogen damage by optimized metallization for memory applications" Apply. Physics Letters, vol. 77, No. 1, Jul. 2000, pp. 76-78.

*Primary Examiner*—Gwendolyn Blackwell
(74) *Attorney, Agent, or Firm*—Dicke, Billig & Czaja, PLLC

(57) ABSTRACT

The invention relates to a microelectronic structure which provides improved protection of a hydrogen-sensitive dielectric against hydrogen contamination. According to the invention, the hydrogen sensitive dielectric (14) is covered at lest by an intermediate oxide (18), where material thickness is at lest five times the thickness of the hydrogen-sensitive dielectric. The intermediate oxide (18) simultaneously acts as an internal dielectric and is metabolized on its surface for this purpose. The intermediate oxide (18), which has a sufficient thickness absorbers the hydrogen that may be released during the deposition of a hydrogen barrier layer (22, 26), thus protecting the hydrogen-sensitive dielectric (14).

8 Claims, 3 Drawing Sheets

U.S. PATENT DOCUMENTS

| | | |
|---|---|---|
| 6,121,083 A | 9/2000 | Matsuki |
| 6,177,351 B1 | 1/2001 | Beratan et al. |
| 6,249,014 B1 | 6/2001 | Bailey |
| 6,455,882 B1 * | 9/2002 | Nakura ....................... 257/295 |
| 2001/0021554 A1 | 9/2001 | Hopfner |

FOREIGN PATENT DOCUMENTS

| | | |
|---|---|---|
| EP | 0 513 894 | 11/1992 |
| EP | 1 006 580 | 6/2000 |
| EP | 1 006 582 | 6/2000 |
| JP | 5094964 | 4/1993 |
| JP | 9-293869 | 11/1997 |
| JP | 10-223852 | 8/1998 |
| JP | 11-087633 | 3/1999 |
| JP | 2001-015696 | 1/2001 |
| JP | 2001-036028 | 2/2001 |
| WO | 0 642 167 | 3/1995 |
| WO | WO 00/46843 | 8/2000 |
| WO | WO 01/24237 | 4/2001 |

* cited by examiner

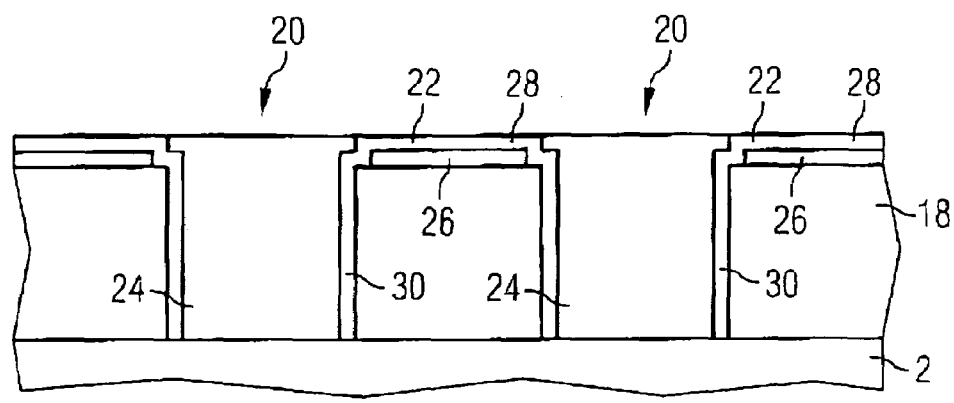
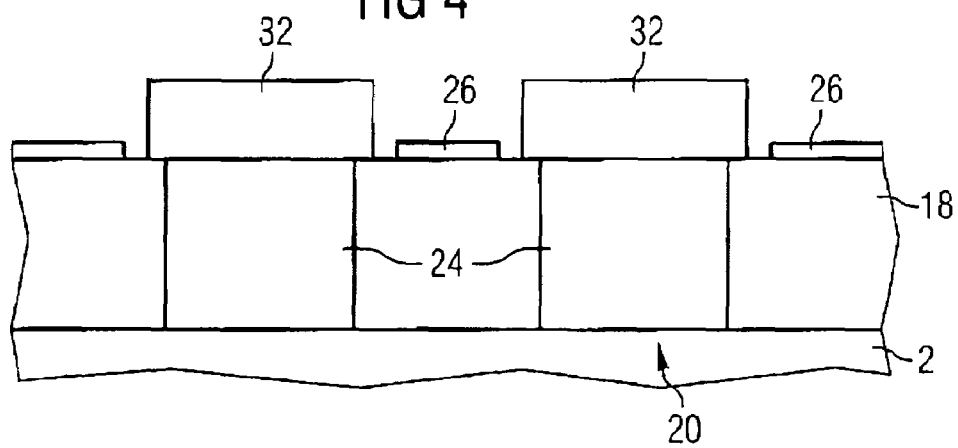

MICROELECTRONIC STRUCTURE HAVING A HYDROGEN BARRIER LAYER

CLAIM FOR PRIORITY

This application claims priority to International Application No. PCT/EP02/04422 which was published in the German language on Nov. 14, 2002, and filed in the German language on May 3, 2001, the contents of which are hereby incorporated by reference.

TECHNICAL FIELD OF THE INVENTION

The invention relates to a microelectronic structure, and in particular, having a hydrogen-sensitive dielectric which is covered by a hydrogen barrier layer and to a method for fabricating a microelectronic structure.

BACKGROUND OF THE INVENTION

Dielectric or ferroelectric layers which react sensitively to hydrogen are used in many microelectronic structures. For example, in the case of metal-oxide-containing ferroelectric layers, the polarizability may be reduced and thereby the functioning of the ferroelectric layer may be restricted.

However, it is almost impossible to prevent the action of hydrogen in the fabrication of semiconductor products in the form of microelectronic structures. For example, the conditioning of the metallization and the transistors requires annealing steps in forming gas (95% N2, 5% W2). Furthermore, many layers are deposited in a hydrogen-containing atmosphere, for example tungsten and silicon nitride. In the case of ferroelectric layers, the action of hydrogen has been demonstrated to adversely affect the electrical properties, in particular: to cause an increased leakage current, short circuits and lower polarization. If the ferroelectric layers are used as capacitor dielectric in a storage capacitor, the action of hydrogen can also lead to a reduction in the bonding of the ferroelectric layers and therefore the storage capacitors on the substrate.

To reduce the effect of hydrogen on hydrogen-sensitive layers, it has been proposed to apply what are known as hydrogen barrier layers to the hydrogen-sensitive layers, in order to protect the latter during subsequent process steps carried out in a hydrogen-containing atmosphere. In the case of storage capacitors, it is customary for the capacitor module to be covered by a hydrogen barrier layer, (encapsulation barrier layer, EBL).

For example, it is known from DE 199 04 379 A1 to cover the upper electrodes of a storage capacitor with a passivation layer and then with a hydrogen barrier layer. The passivation layer is intended to prevent the catalytic cracking of ammonia by the metal-containing upper electrode, which is required for deposition of the passivation layer. The catalytic cracking of ammonia leads to the direct release of hydrogen, which with an uncovered upper electrode, can diffuse through the latter to the capacitor dielectric. However, it has been found that although this passivation layer substantially prevents catalytic cracking of ammonia, it does not otherwise offer sufficient protection against the hydrogen which is inherently released by the deposition reaction.

It is also known from EP 0 513 894 A2 to apply a hydrogen barrier layer direct to the capacitor module and in particular to the edge regions of the capacitor electrodes, which are not covered by the ferroelectric layer. If the hydrogen barrier layer consists of an electrically conductive material, in accordance with EP0 513 894 A2 an insulating layer has to be provided between the hydrogen barrier layer and the capacitor module.

By contrast, in accordance with U.S. Pat. No. 6,027,947 the problem of hydrogen diffusion is supposed to be alleviated by encapsulating the upper capacitor electrode by means of the ferroelectric.

Furthermore, it has been found that during the deposition of the hydrogen barrier layers, not only is there a risk of the ferroelectric layer being contaminated by hydrogen, but also further problems are presented by the plasma which is used during the deposition of subsequent layers (e.g. hydrogen diffusion barrier, oxide layers). These difficulties may in particular involve electrostatic charging of the capacitor electrode and consequently damage to the ferroelectric layer.

SUMMARY OF THE INVENTION

The invention provides a microelectronic structure in which such damage is substantially prevented.

In the microelectronic structure described, by virtue of the fact that at least one intermediate oxide, which is at least five times as thick as the hydrogen-sensitive dielectric, is arranged between the hydrogen-sensitive dielectric and the hydrogen barrier layer.

According to one embodiment of the invention, the minimum thickness of the intermediate layer is five times and preferably even ten times greater than the thickness of the hydrogen-sensitive dielectric is to be. Therefore, the hydrogen barrier layer does not lie directly on the hydrogen-sensitive dielectric or in its immediate vicinity, but rather is separated from the latter at least by the intermediate oxide. The relatively substantial thickness of the intermediate oxide ensures that any hydrogen which is formed during the deposition of the hydrogen barrier layer cannot diffuse as far as the hydrogen-sensitive dielectric. The intermediate oxide absorbs a relatively high proportion of the hydrogen which has diffused in. The absorption capacity of the intermediate oxide increases with its thickness. Therefore, it is preferable if the thickness of the intermediate oxide is considerably greater than five times the thickness of the hydrogen-sensitive layer.

It is preferable for the intermediate oxide to simultaneously fulfill the function of what is known as an intermetal dielectric, i.e. for a metallization layer to be arranged on the intermediate oxide and contact holes which connect the metallization layer to functional elements below the intermediate oxide to be formed in the intermediate oxide. In this case, the contact holes are preferably filled with a conductive material. Therefore, the hydrogen barrier layer is displaced out of the region of the hydrogen-sensitive dielectric in the region above the intermediate oxide. Since the intermediate oxide simultaneously fulfils the function of an intermetal dielectric, it is in this case possible to eliminate the need to deposit an additional layer, as required by the prior art described in the introduction, provided that an intermetal dielectric is fundamentally present in the microelectronic structure. This is to be explained in more detail below on the basis of the example of a ferroelectric capacitor of a memory cell of a semiconductor component.

A ferroelectric capacitor of this type is generally positioned on an insulation layer which separates it from the actual semiconductor substrate. The capacitor comprises a lower electrode and an upper electrode with a ferroelectric dielectric between them. The lower electrode is connected to the semiconductor substrate via a conductive connection formed in the insulation layer. The upper electrode, by contrast, is electrically conductively connected to a metallization which is arranged on an intermetal dielectric which covers the capacitor in a planarizing manner. The connection between the metallization and the upper electrode is produced by contact holes filled with conductive material.

According to another embodiment of the invention, the hydrogen barrier layer is applied to an intermetal dielectric of this type which simultaneously serves as an intermediate oxide, so that the hydrogen barrier layer is no longer, as in the prior art, arranged below the intermetal dielectric, but rather is arranged above it. The associated advantages are firstly an improved absorption of hydrogen and secondly improved protection against damage induced by a plasma. In particular, the sufficient thickness of the intermetal dielectric or of the intermediate oxide offers sufficient protection against hydrogen. Furthermore, the intermetal dielectric or the intermediate oxide protects the capacitor electrodes from electrostatic charging during the plasma deposition of the hydrogen barrier layer.

One advantage of the invention is the fact that in the microelectronic structure according to the invention, what is known as a recovery anneal can be carried out after the deposition of the intermediate oxide, in order to eliminate any damage which has formed in the hydrogen-sensitive layer prior to deposition of the hydrogen barrier layer. A hydrogen-sensitive layer which has been annealed in this way is protected by the relatively thick intermediate oxide during the subsequent deposition of the hydrogen barrier layer.

The intermediate oxide is preferably a silicon oxide layer which is applied by means of a TEOS method or using a SOG (spin-on glass) method. One advantage of this methods is the fact that they can be carried out in an ammonia-free atmosphere. For example, the TEOS method can be carried out with simple ozone activation. A further advantage is the planarization of the surface of the microelectronic structure by the intermediate oxide. The planarization facilitates the subsequent process steps. Therefore, the intermediate oxide is preferably a planarizing layer.

It is preferable for the hydrogen barrier layer also to line the side walls of the contact holes, in order to prevent lateral penetration of hydrogen into the intermediate oxide. The hydrogen barrier layer may consist of either an insulating material or an electrically conductive material, if an electrically conductive material is used, it should preferably be covered by an insulating layer, in order to prevent any short circuits to the metallization. To further improve the electrical insulation with respect to the hydrogen barrier layer produced from an electrically conductive material, it is possible for the hydrogen barrier layer to be drawn back from the edges of the contact holes.

It is preferable for the hydrogen-sensitive dielectric to be a metal-oxide-containing layer which forms a paraelectric or a ferroelectric. In this case, the metal-oxide-containing layer preferably takes the general form—Ox, where A stands for at least one metal selected from the group consisting of barium (Ba), strontium (Sr), bismuth (Bi), lead (Pb), zirconium (Zr), lanthanum (La), niobium (Nb), potassium (K) or calcium (Ca), B stands for titanium (Ti), tantalum (Ta), niobium (Nb), or ruthenium (Ru) and 0 stands for oxygen (O).

Furthermore, it is preferable for the hydrogen-sensitive dielectric to serve as a capacitor dielectric and to be arranged between two metal-containing electrodes, in which case one of the two electrodes is arranged between the hydrogen-sensitive dielectric and the intermediate oxide. The capacitor electrodes in this case preferably comprise platinum (Pt), ruthenium (Ru), rhenium (Re), rhodium (Rh), palladium (Pa), tridium (Ir), iridium oxide, ruthenium oxide, strontium ruthenium oxide or an alloy of these materials.

The thickness of the intermediate oxide is highly dependent on the feature size used in the fabrication of the microelectronic structure. The smaller the feature size (the smallest lithographic resolution which can be achieved), the lower the layer thickness of the individual functional layers will generally be. In the case of dynamic semiconductor memories, this is because a storage capacitor always has to store a minimum charge, and in the case of structures of reduced size and therefore reduced surface area this can be achieved by reducing the layer thickness of the capacitor dielectric. As the structures are reduced in size, in principle it is generally also necessary for all the other layers to be made thinner. For the feature sizes of between 0.25 and 0.17 µm which are currently customary, the intermediate oxide should have a layer thickness of greater than 200 nm. It is even preferable for the intermediate oxide to be thicker than 400 nm. The thicker the intermediate oxide is formed to be, the more strongly its protective action comes to the fore. With future feature sizes of 0.1 µm and below, the intermediate oxide may have a layer thickness of less than 200 nm, since the hydrogen barrier layer itself will likewise be thinner and therefore the deposition time in a hydrogen-containing atmosphere will be reduced.

A further advantage which has emerged is that the bonding of the hydrogen-sensitive dielectric remains of constant high quality even after a forming gas anneal, on account of the protective action of the thick intermediate oxide in conjunction with the hydrogen diffusion barrier. No detachment of individual layers was observed. Furthermore, the thick intermediate oxide also protects the hydrogen-sensitive dielectric below from the mechanical effects of plasma deposition processes, which may be caused, for example, by impinging ions.

In another embodiment of the invention, there is a method for fabricating a microelectronic structure having a hydrogen-sensitive dielectric in which the protection of the hydrogen-sensitive dielectric is improved. This method for fabricating a microelectronic structure which has a hydrogen-sensitive dielectric covered by a hydrogen barrier layer, comprises:

at least one intermediate oxide is applied to a substrate;

at least one intermediate oxide is applied to the hydrogen-sensitive dielectric in a thickness which is at least equal to five times the thickness of the hydrogen-sensitive dielectric; and the intermediate oxide is covered with a hydrogen barrier layer, It is preferable for the intermediate oxide to be applied by means of spin-on glass or a TEOS method. Furthermore, it is preferable if, after the hydrogen barrier layer has been applied, contact holes are etched into the intermediate oxide and the side walls of the contact holes are lined with an insulating layer. The insulating layer may in this case include the same material as the hydrogen barrier layer, so that the two together perform the function of the hydrogen barrier layer. The hydrogen barrier layer, on the other hand, may also include a conductive material, in which case the hydrogen barrier layer should be covered by the insulating layer.

In principle, the insulating layer may also be made from two partial layers, in which case the first partial layer is applied to the intermediate oxide or to the hydrogen barrier layer prior to the etching of the contact holes, but the second partial layer is applied conformally to the intermediate oxide after the etching of the contact holes, the second partial layer then being etched back anisotropically to form edge webs which line the side walls of the contact holes. In this case, the insulating layer is formed by the first partial layer, which lies on the surface of the intermediate oxide or of the hydrogen barrier layer, and t h e second partial layer, which lines the side walls of the contact holes. The insulating layer preferably consists of silicon nitride.

BRIEF DESCRIPTION OF THE DRAWINGS

The invention is to be explained below based on exemplary embodiments which are illustrated in the figures, in which:

FIG. 3 shows a microelectronic structure according to the invention with the hydrogen barrier layer drawn back from the edges of the contact holes and an insulating layer and.

FIG. 4 shows a microelectronic structure according to the invention with a metallization applied.

DETAILED DESCRIPTION OF THE INVENTION

Figure 1:
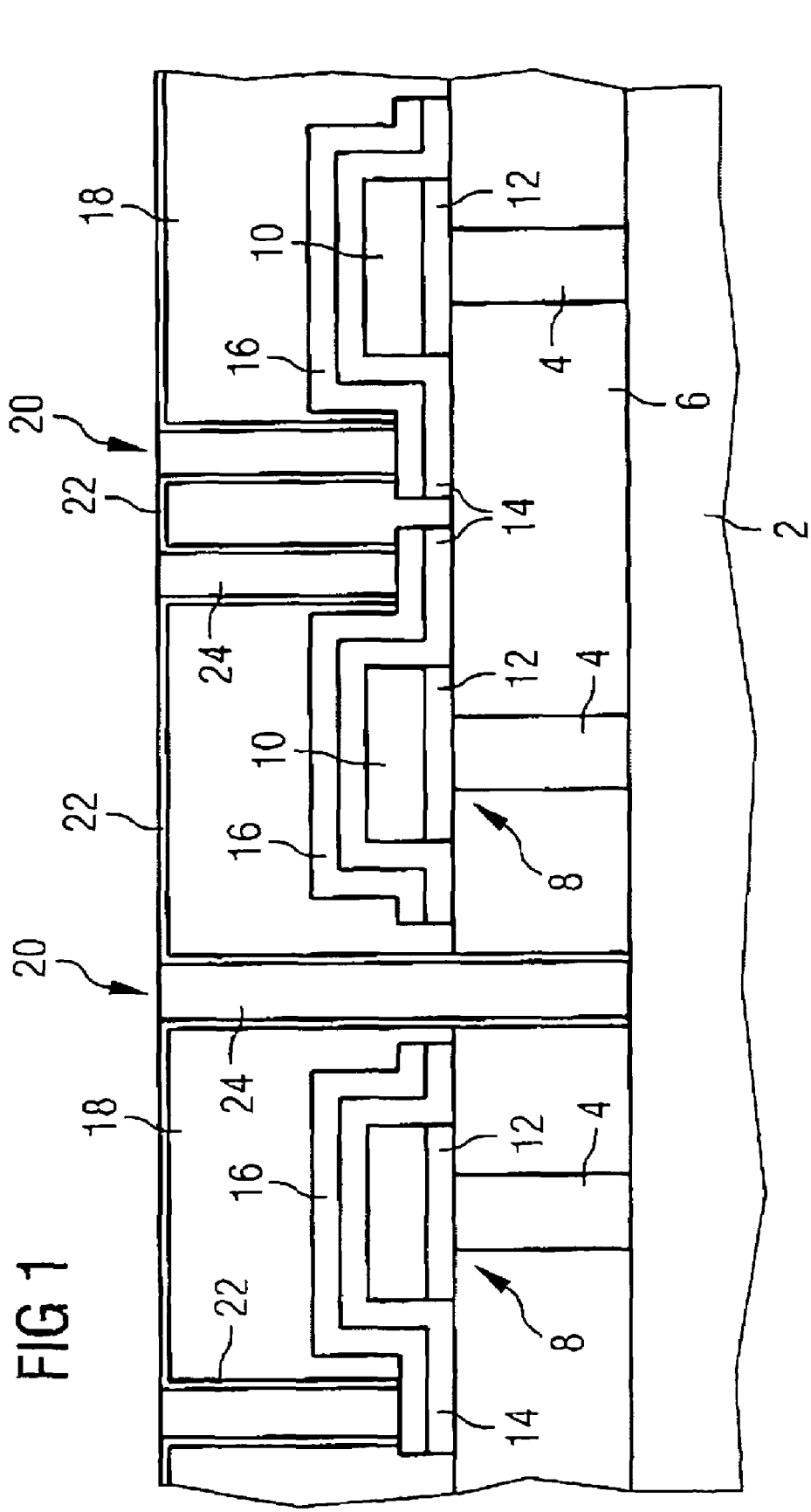
FIG. 1 shows a microelectronic structure according to the invention.

FIG. 1 shows a semiconductor substrate 2 which is covered by an insulation layer 6 through which contact holes 4 pass. The lower electrodes 8 of the individual storage capacitors are located on the insulation layer 6 above the corresponding contact holes 4. The electrodes 8 in this case comprise a metal electrode 10 and an oxygen barrier layer 12 located between the metal electrode 10 and the corresponding contact hole 4. The oxygen barrier layer 12 is intended to prevent diffusion of oxygen through the contact holes 4, which are filled with conductive material, to the semiconductor substrate 2. If the contact holes 4 are formed with polysilicon, the oxygen barrier layer 12 10 prevents the oxidation of polysilicon and therefore ensures that the contact holes 4 are not covered by an insulating silicon oxide layer. The oxygen barrier layer may also be composed of a plurality of individual layers. An example of a suitable material for production of the oxygen barrier layer is partially oxidized iridium oxide. If appropriate, bonding agent layers may be located between the oxygen barrier layer and the insulation layer 6.

The lower electrodes 8 are each covered with a ferroelectric layer 14 and an upper electrode 16 in the form of a metal layer. The ferroelectric layer and the metal layer are each deposited conformally and are preferably patterned together by means of anisotropic etching methods. The upper electrodes 16 are then formed from the metal layer which has been patterned in this way. The metal electrodes 10 and the upper electrodes 16 preferably consist of a precious metal, such as for example Platinum, or of Palladium, Iridium, Rhenium, Osmium or Ruthenium. Preferred materials for the ferroelectric layer 14 are strontium bismuth tantalite (SBT, $SrBi_2Ta_2O9$), niobium-doped strontium bismuth tantalate (SBTN, $SrBi_2(Ta,Nb)_2O_9$), lead zirconium titanate ($Pb(Zr,Ti)O_3$) or bismuth titanate (BTO,$Bi_4Ti_3O_{12}$)—As an alternative to a ferroelectric layer, it is also possible to use a paraelectric layer with a high dielectric constant (e.g. greater than 20, preferably greater than 50). An example of a material of this type is barium strontium titanate (BST, $(Ba,Sr)TiO_3$). The above materials are in general terms metal-oxide-containing materials of the general form $ABO_x$. The lower electrodes, the ferroelectric layer and the upper electrodes together in each case form a storage capacitor. The storage capacitors are covered by a planarizing layer 18, which in this case forms the intermediate oxide. To avoid hydrogen and plasma damage, the intermediate oxide 18 can be deposited, for example, using a SOG method or using an ozone-activated TEOS method. The SOG method is a low-temperature method which cannot cause either plasma or hydrogen damage. A further advantage of the SOG method lies in its high degree of planarization of the surface. An ozone-activated TEOS method likewise works in a hydrogen-free atmosphere. In principle, any oxide is a suitable material for the intermediate oxide 18, even if it is deposited in a hydrogen-containing atmosphere. However, an oxide of this type should offer sufficient permeability to oxygen, so that a recovery anneal in an oxygen-containing atmosphere can be carried out after deposition in order to eliminate the hydrogen damage in the ferroelectric layer.

The intermediate oxide 18 has contact holes which extend either as far as the upper electrodes 16 or as far as the semiconductor substrate 2. The contact holes are lined with an insulating layer 22 and are filled with a conductive material 24. At the same time, the insulating layer 22 also covers the surface of the intermediate oxide 18. At the same time, the insulating layer 22 forms the hydrogen barrier layer. The lining of the contact holes with the insulating layer 22 which serves as a hydrogen barrier layer seduces lateral inward diffusion of hydrogen. As a result, the contact holes 20 may, for example, also be filled with tungsten, which is usually deposited in a hydrogen-containing atmosphere or during the deposition of which large quantities of hydrogen are released.

The ferroelectric layer preferably has a thickness of 50-100 nm. By contrast, the thickness of the intermediate oxide should be at least 300-800 nm. These values are given by way of example for a technology with a feature size of 0.25 µm.

The insulating layer 22 used as a hydrogen diffusion barrier preferably consists of silicon nitride, which is deposited by means of a LP-CVD (low-pressure chemical vapor deposition) process. Silicon nitride should in this case as far as possible be in a stoichiometric ratio.

Figure 2A:
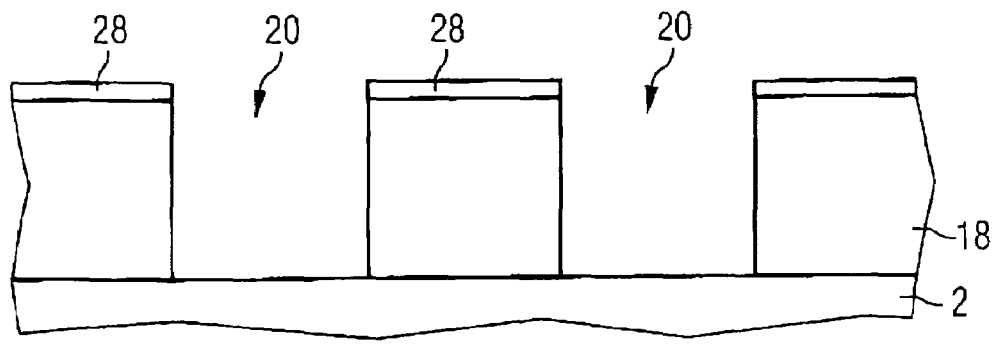
FIGS. 2A-2C show individual method steps used for the fabrication of a microelectronic structure according to the invention.

The text which follows is to explain individual method steps of the fabrication method according to the invention in more detail. FIG. 2A illustrates a semiconductor substrate 2 with intermediate oxide 18 above it. A hydrogen barrier layer is arranged on the surface of the intermediate oxide 18 in the form of a first partial layer 28. The first partial layer 28 and the intermediate oxide 18 have been patterned together. Alternatively, it is also possible for the first partial layer 28 to be etched first, followed by the intermediate oxide 18, using the patterned partial layer 28 as a mask. The etching creates contact holes in the intermediate oxide 18.

Figure 2B:
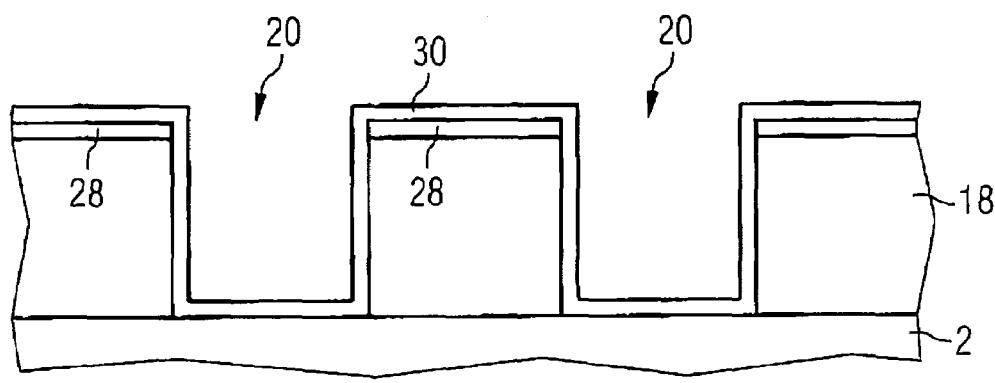

After the etching has taken place, a second partial layer, which in particular covers the side walls of the contact holes 20, is applied conformally. The result of this process step is illustrated in FIG. 2B.

Figure 2C:
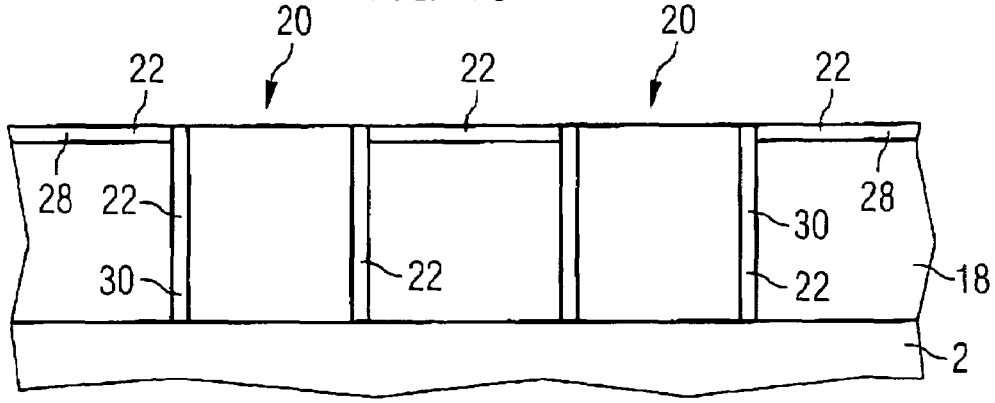

Then, the second partial layer 30 is etched back anisotropically, so that edge webs on the side walls of the contact holes remain. Finally, the contact holes 20 are filled with a conductive material 24. FIG. 2C shows the structure obtained in this way. The first partial layer 28 and the second partial Layer 30 together form the hydrogen barrier layer 22. The two-stage method for fabrication of the hydrogen barrier layer 22 serves in particular to completely cover the intermediate oxide 18, apart from the base regions, with the hydrogen barrier layer.

If the hydrogen barrier layer includes an electrically conductive material, it must be covered with an insulating layer in order to avoid short circuits. In this case., the hydrogen barrier layer is applied to the intermediate oxide 18, and then the insulating layer is applied, preferably in the form of a first partial layer. Then, the first partial layer of the insulating layer, the hydrogen barrier layer and the intermediate oxide are etched, a second partial layer is deposited conformally and etched back anisotropically. This method sequence differs from that shown in FIGS. 2R-2B only by virtue of the fact that the hydrogen barrier layer is located beneath the partial layers 28, 30, which now serve as an insulating layer 22.

FIG. 3 shows such a structure. In this case, the hydrogen diffusion barrier 26, which consists of a conductive material, is additionally set back laterally from the edge8 of the contact holes 20. This is intended to improve the insulation of the conductive hydrogen diffusion barrier with respect to the contact holes.

Finally, FIG. 4 shows a hydrogen diffusion barrier made from a conductive material which is likewise set back from the side edges of the contact holes. The metallization 32, which preferably comprises aluminum, copper, an aluminum alloy or a copper alloy, is positioned above the contact holes 20. If the hydrogen barrier layer 26 or the insulating layer 22 projects as far as the side edges of the contact holes and even into the contact holes 20, the metallization 32 is also positioned above these layers.

Suitable materials for the hydrogen diffusion barrier are, for example, silicon nitride and silicon oxynitride as electrically insulating materials, and for example TiN TiSiN, TaN , TaSiN as electrically conductive materials (cf. for example German Patent Application 100 56 295.7 in the name of the same Applicant, to the entire contents of which reference is hereby made).

The invention claimed is:

1. A microelectronic structure having a hydrogen-sensitive dielectric, comprising a metal-oxide-containing layer, which is a ferroelectric or a paraelectric which is covered by a hydrogen barrier layer, wherein the hydrogen barrier layer comprises an electrically insulating material, and at least one intermediate oxide, which is at least five times as thick as the hydrogen-sensitive dielectric, is arranged between the hydrogen-sensitive dielectric and the hydrogen barrier layer, and wherein the intermediate oxide comprises contact holes arranged therein, the hydrogen barrier layer covers the intermediate oxide and lines side walls of the contact holes but not base regions of the contact holes, and the contact holes are filled with conductive material.

2. The microelectronic structure as claimed in claim 1, wherein the intermediate oxide is a spin-on glass or a TEOS layer.

3. The microelectronic structure as claimed in claim 1, wherein the hydrogen barrier layer includes silicon nitride.

4. The microelectronic structure as claimed in claim 1, wherein the metal-oxide-containing layer takes the general form $ABO_x$, where A stands for at least one metal selected from the group consisting of barium, strontium, bismuth, lead, zirconium, lanthanum, niobium, potassium or calcium, B stands for titanium, tantalum, niobium or ruthenium and O stands for oxygen.

5. The microelectronic structure of claim 1, wherein the hydrogen barrier layer completely covers the intermediate oxide.

6. The microelectronic structure of claim 1, wherein the intermediate oxide has a planar surface and a metallization is on the planar surface.

7. The microelectronic structure as claimed in claim 1, wherein the hydrogen-sensitive dielectric serves as capacitor dielectric and is arranged between two metal-containing electrodes, one of the two electrodes being arranged between the hydrogen-sensitive dielectric and the intermediate oxide.

8. The microelectronic structure as claimed in claim 7, wherein the metal-containing electrodes comprise platinum, ruthenium, rhenium, rhodium, palladium, iridium, iridium oxide, ruthenium oxide, strontium ruthenium oxide or an alloy of these materials.

* * * * *